(12) United States Patent
Chen et al.

(10) Patent No.: US 12,382,660 B2
(45) Date of Patent: Aug. 5, 2025

(54) STRUCTURE AND FORMATION METHOD OF SEMICONDUCTOR DEVICE WITH EMBEDDED EPITAXIAL STRUCTURE

(71) Applicant: Taiwan Semiconductor Manufacturing Company, Ltd., Hsinchu (TW)

(72) Inventors: Ting-Yeh Chen, Hsinchu (TW); Wei-Yang Lee, Taipei (TW); Chia-Pin Lin, Xinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 266 days.

(21) Appl. No.: 17/313,156

(22) Filed: May 6, 2021

(65) Prior Publication Data
US 2022/0359763 A1    Nov. 10, 2022

(51) Int. Cl.
*H10D 30/67* (2025.01)
*H01L 21/02* (2006.01)
(Continued)

(52) U.S. Cl.
CPC ..... *H10D 30/6713* (2025.01); *H01L 21/0259* (2013.01); *H01L 21/3065* (2013.01); *H10D 30/0217* (2025.01); *H10D 30/031* (2025.01); *H10D 30/6735* (2025.01); *H10D 30/6757* (2025.01); *H10D 30/797* (2025.01); *H10D 62/021* (2025.01); *H10D 62/118* (2025.01);
(Continued)

(58) Field of Classification Search
CPC ........... H01L 29/78618; H01L 21/0259; H01L 21/3065; H01L 29/0665; H01L 29/1083; H01L 29/42392; H01L 29/66537; H01L 29/66545; H01L 29/66553; H01L 29/66636; H01L 29/66742; H01L 29/7848; H01L 29/78696; H01L 29/0673; H01L 29/66439; H01L 29/0847; H01L 29/1079; H01L 29/165; H01L 29/6656; H01L 21/31116; H01L 29/775; H01L 21/823431; H01L 21/823412; H01L 21/823481; H01L 27/0886; B82Y 10/00
See application file for complete search history.

(56) References Cited

U.S. PATENT DOCUMENTS 9,209,247 B2   12/2015   Colinge et al.
9,236,267 B2   1/2016    De et al.
(Continued)

*Primary Examiner* — Eva Y Montalvo
*Assistant Examiner* — Zhijun Xu
(74) *Attorney, Agent, or Firm* — Birch, Stewart, Kolasch & Birch, LLP

(57) ABSTRACT

A semiconductor device structure and a method for forming a semiconductor device structure are provided. The semiconductor device structure includes a stack of channel structures over a semiconductor fin and a gate stack wrapped around the channel structures. The semiconductor device structure also includes a source/drain epitaxial structure adjacent to the channel structures and an isolation structure surrounding the semiconductor fin. A protruding portion of the semiconductor fin protrudes from a top surface of the isolation structure. The semiconductor device structure further includes an embedded epitaxial structure adjacent to a first side surface of the protruding portion of the semiconductor fin.

20 Claims, 19 Drawing Sheets

(51) Int. Cl.
*H01L 21/3065* (2006.01)
*H10D 30/01* (2025.01)
*H10D 30/69* (2025.01)
*H10D 62/00* (2025.01)
*H10D 62/10* (2025.01)
*H10D 62/17* (2025.01)
*H10D 64/01* (2025.01)

(52) U.S. Cl.
CPC ......... *H10D 62/371* (2025.01); *H10D 64/017* (2025.01); *H10D 64/018* (2025.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2016/0315193 A1* | 10/2016 | Kim .................... H01L 27/0886 |
| 2016/0365452 A1* | 12/2016 | Tung .................... H01L 21/3247 |
| 2018/0182845 A1* | 6/2018 | Seong ............. H01L 21/823871 |
| 2019/0019888 A1* | 1/2019 | Yun ................. H01L 21/823418 |
| 2019/0139811 A1* | 5/2019 | Jang .................. H01L 29/66545 |
| 2021/0074823 A1* | 3/2021 | Glass .................. H01L 29/7851 |
| 2021/0118887 A1* | 4/2021 | Kuo ..................... H10B 12/485 |
| 2022/0093592 A1* | 3/2022 | Guler ....................... G11C 5/06 |

* cited by examiner

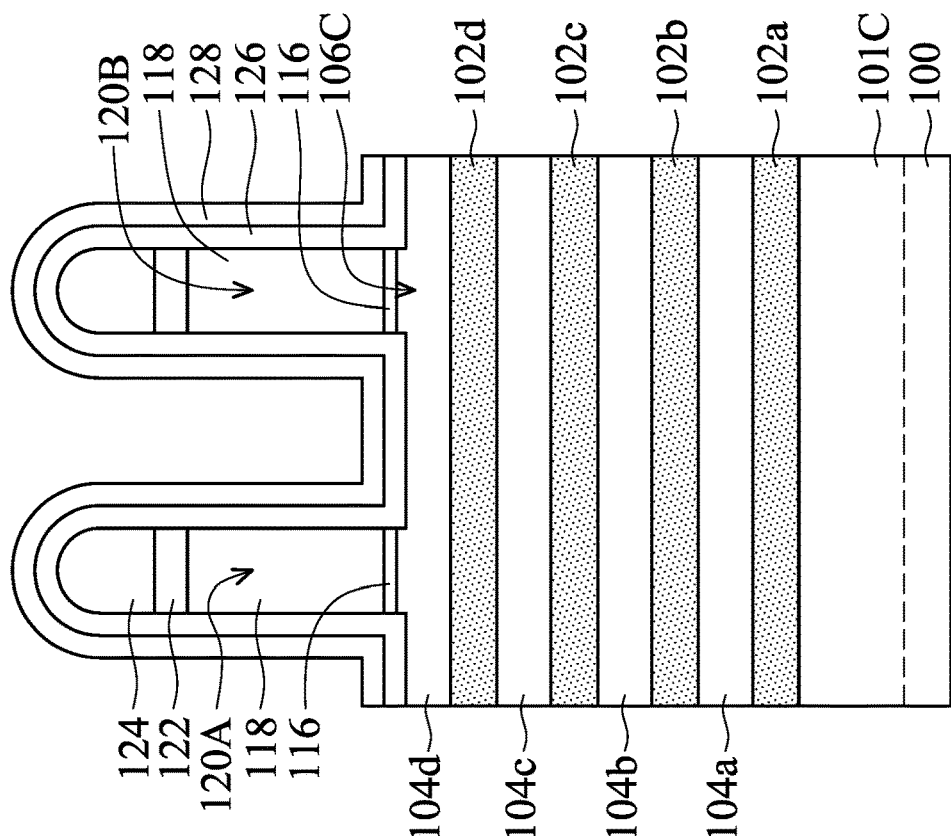
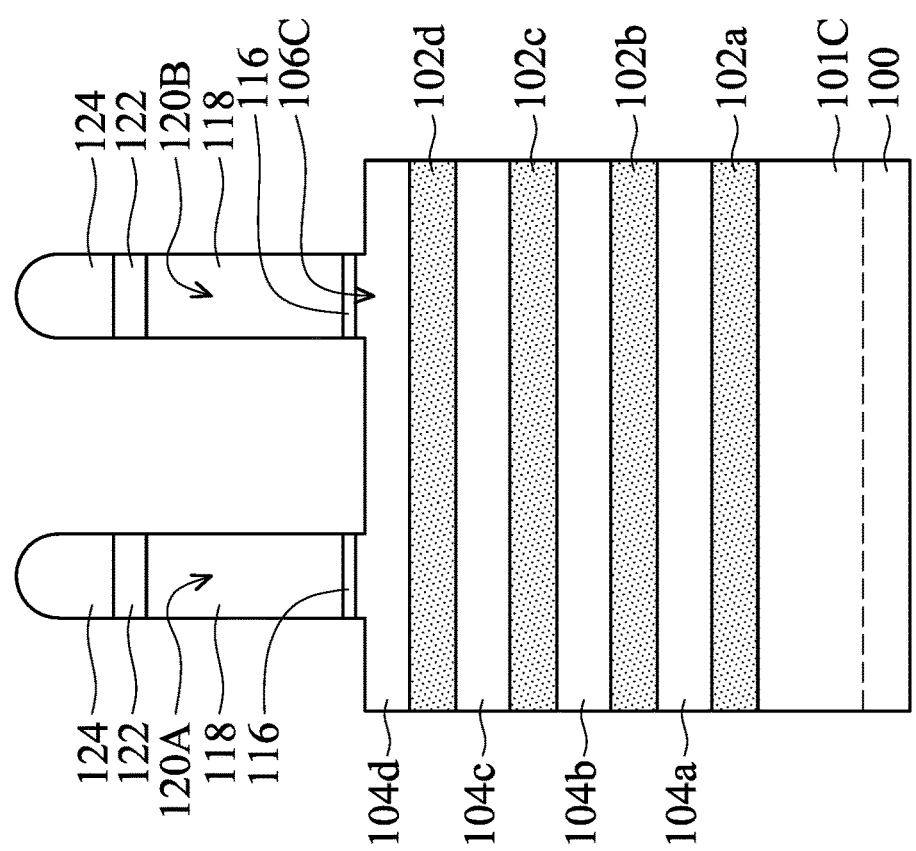

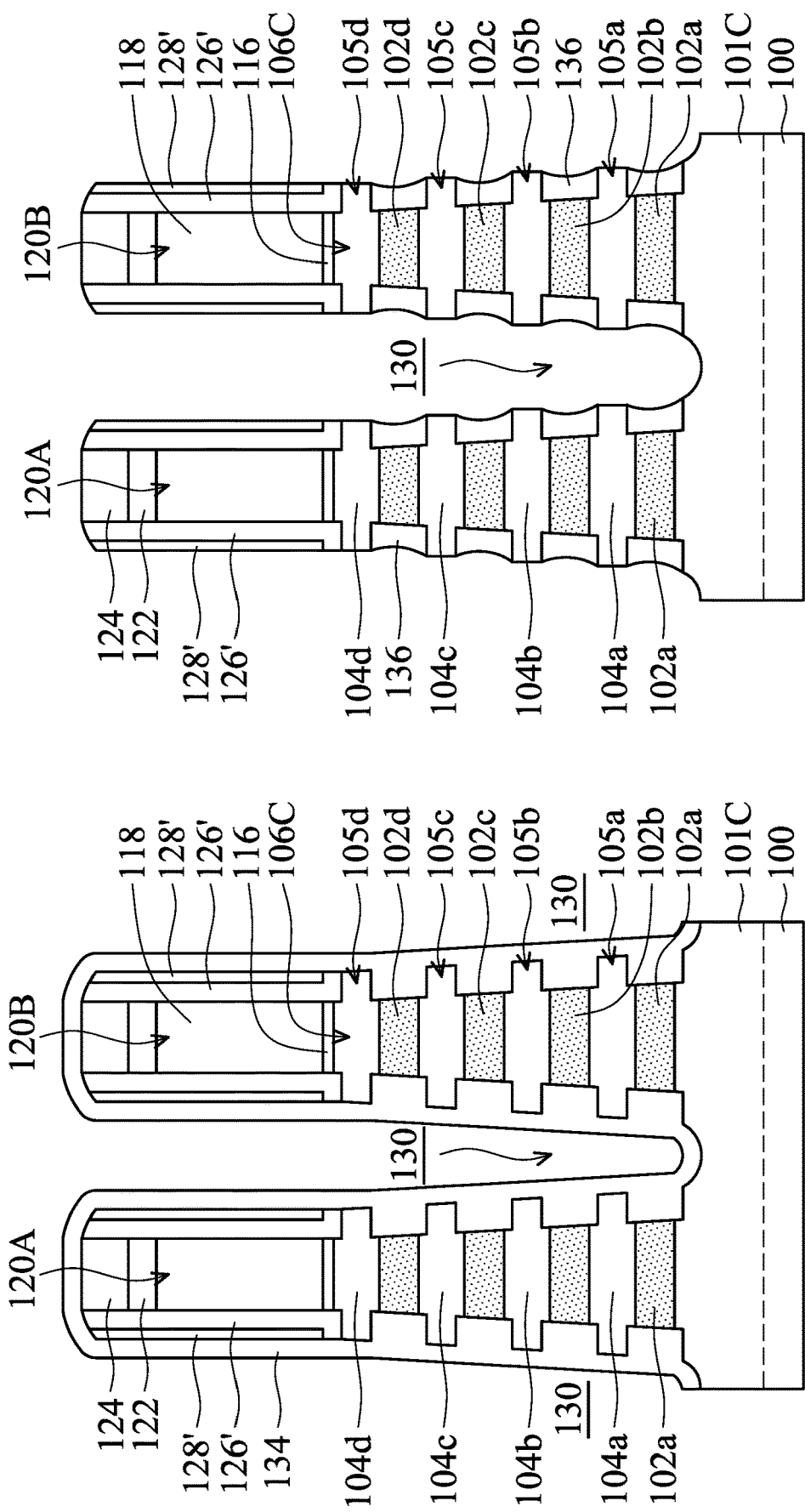

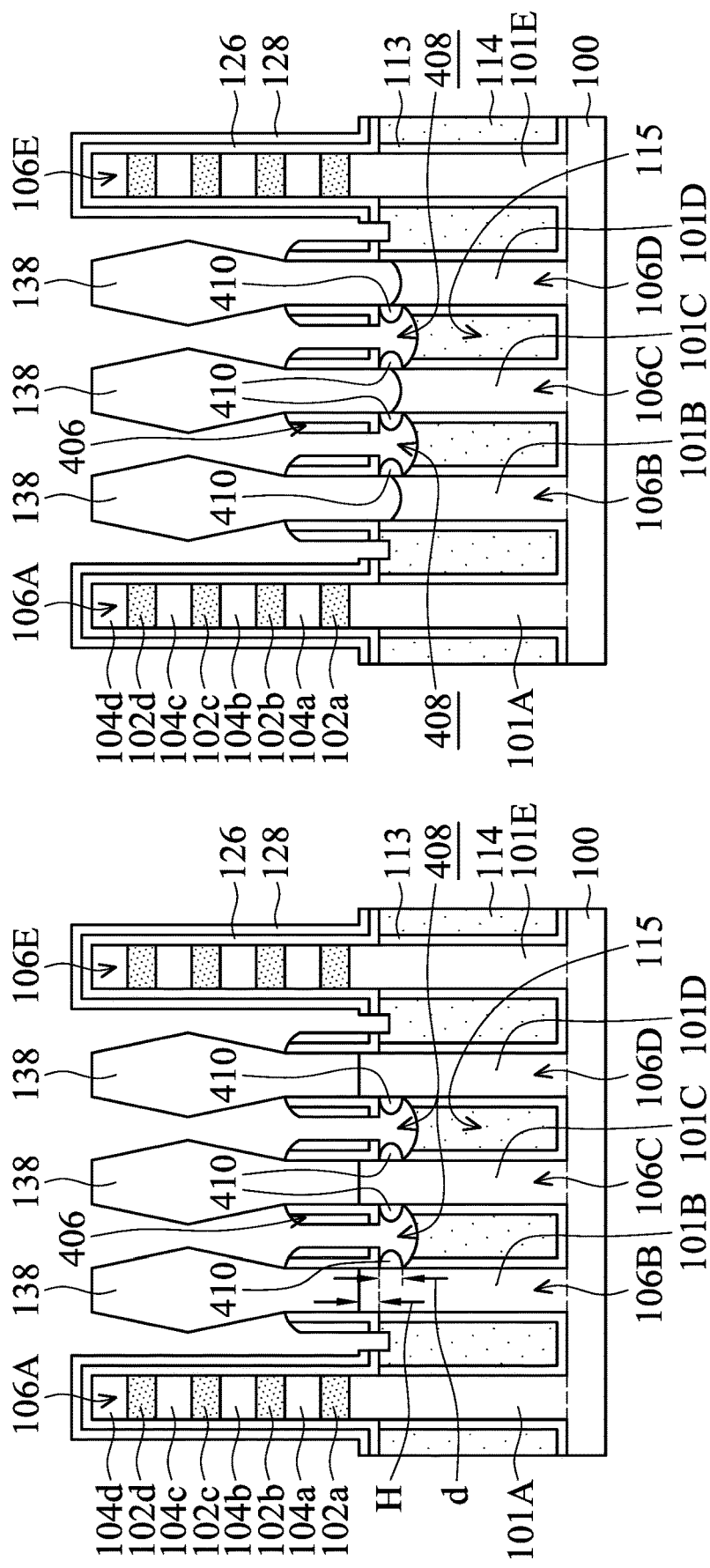

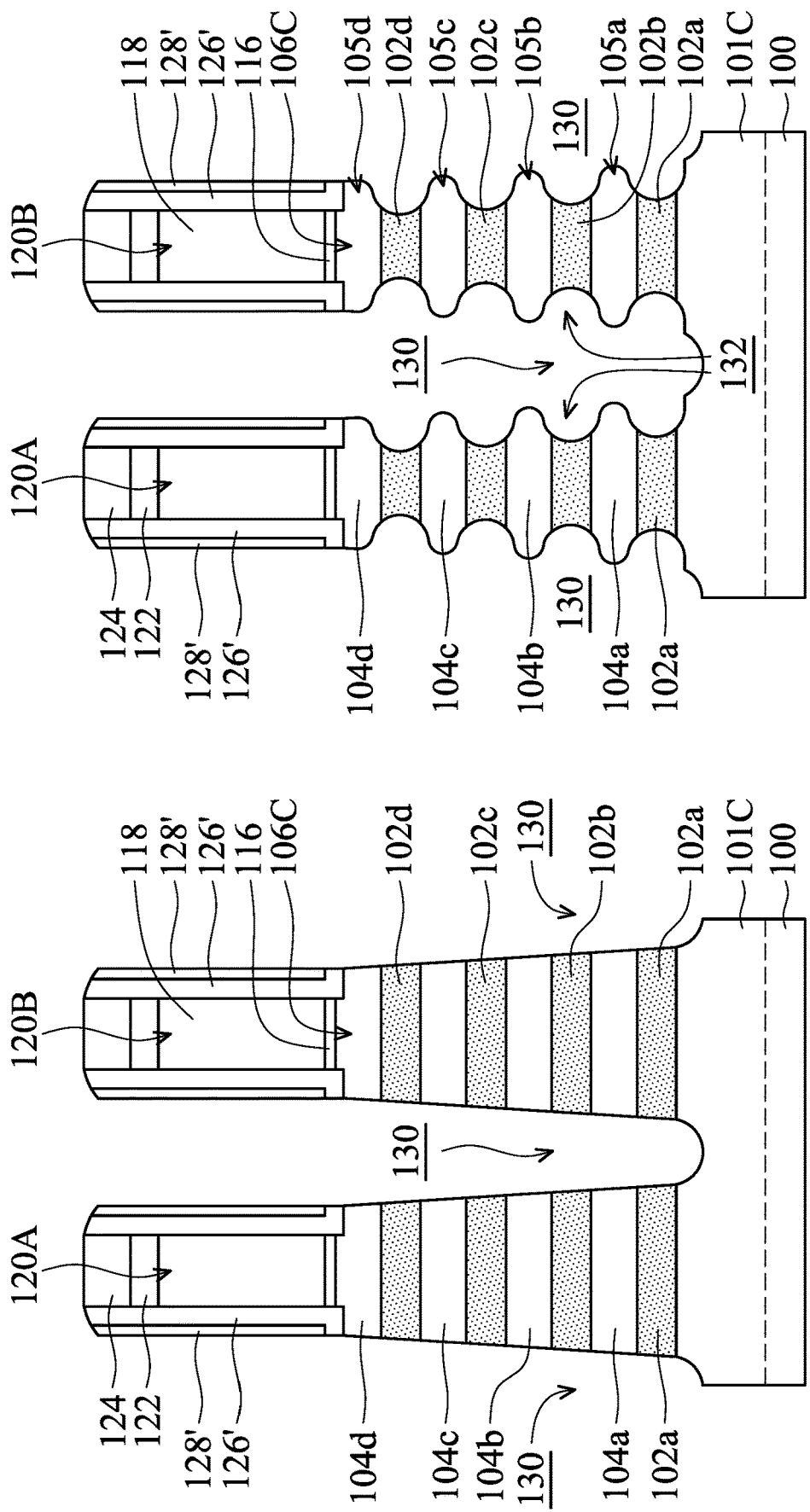

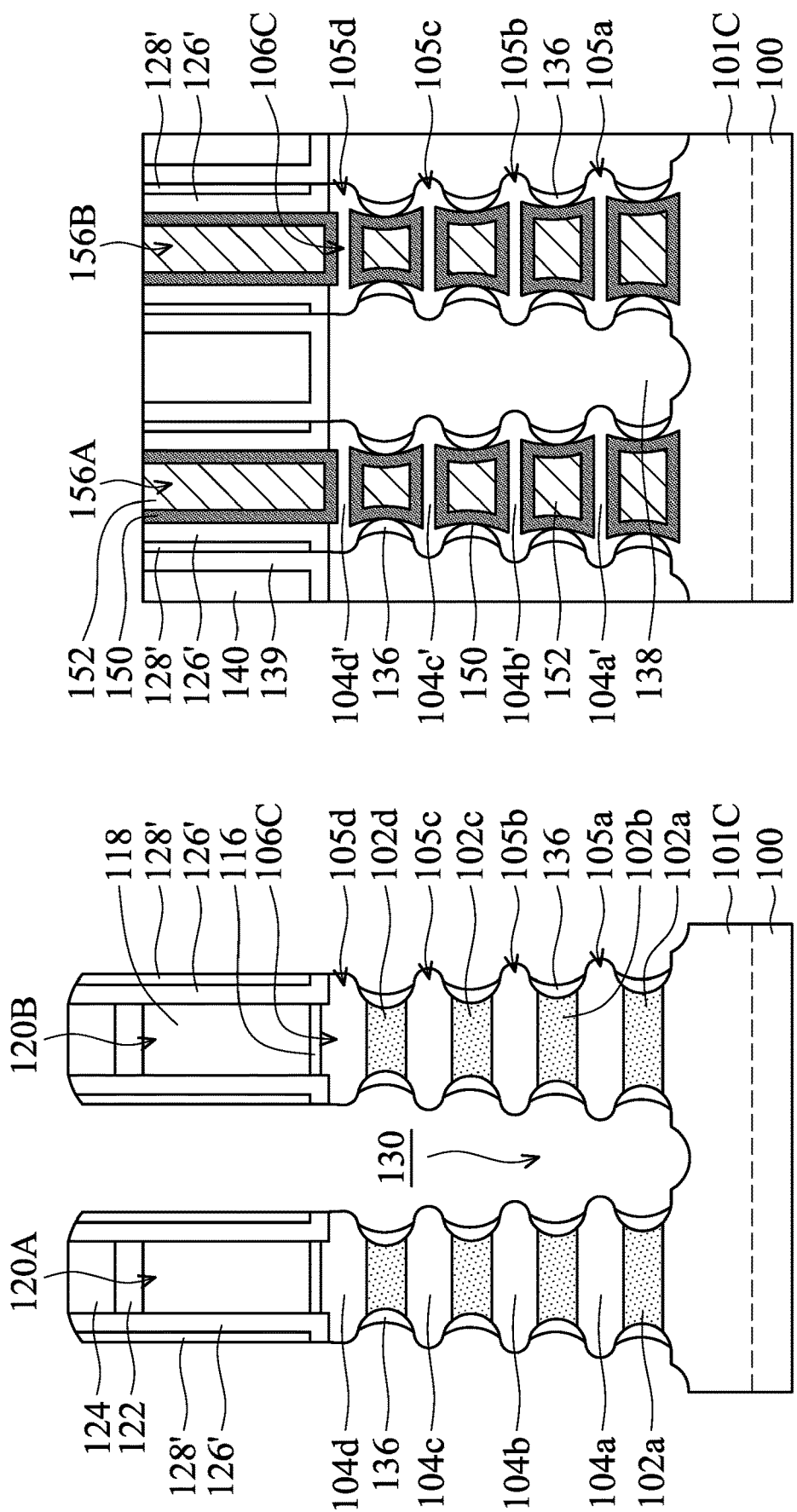

STRUCTURE AND FORMATION METHOD OF SEMICONDUCTOR DEVICE WITH EMBEDDED EPITAXIAL STRUCTURE

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3K are cross-sectional views of various stages of a process for forming a portion of a semiconductor device structure, in accordance with some embodiments.

FIGS. 4A-4E are cross-sectional views of various stages of a process for forming a portion of a semiconductor device structure, in accordance with some embodiments.

FIG. 5 is a cross-sectional view of an intermediate stage of a process for forming a portion of a semiconductor device structure, in accordance with some embodiments.

FIGS. 10A-10D are cross-sectional views of various stages of a process for forming a portion of a semiconductor device structure, in accordance with some embodiments.

DETAILED DESCRIPTION

Figure 1A:
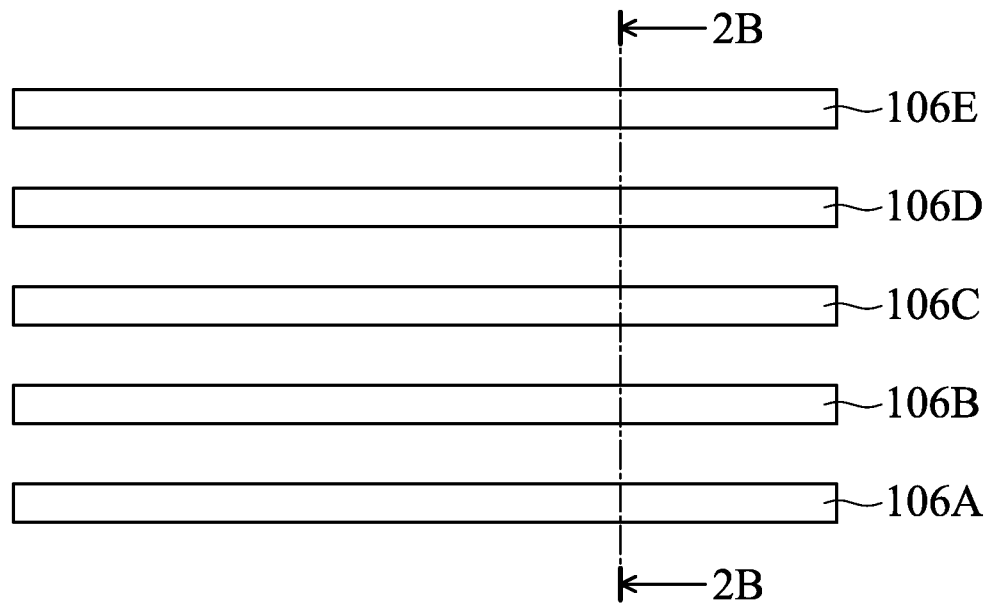
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10° in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% in some embodiments. The term "about" in relation to a numerical value x may mean x±5 or 10% in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
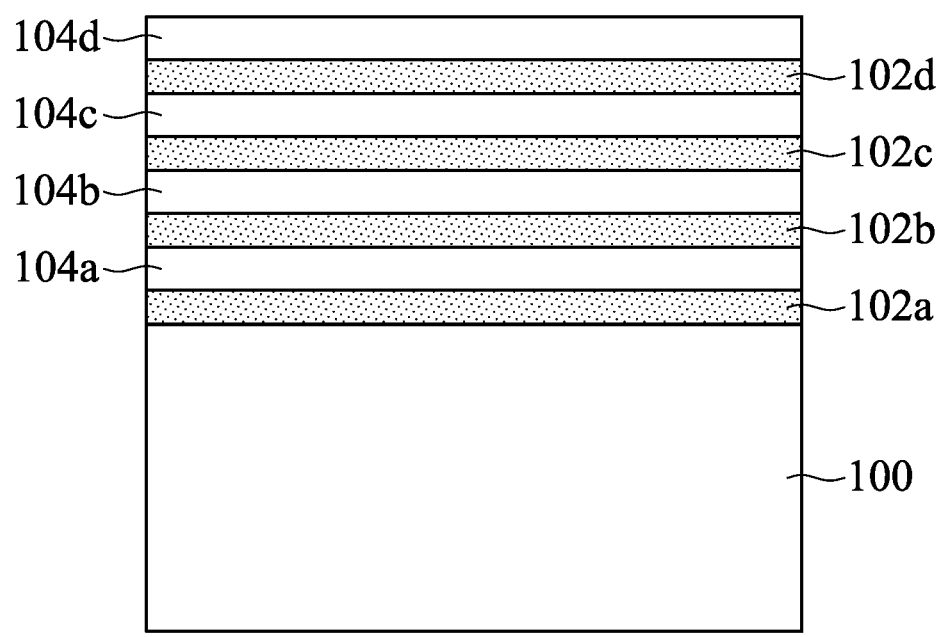
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104d. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Figure 2B:
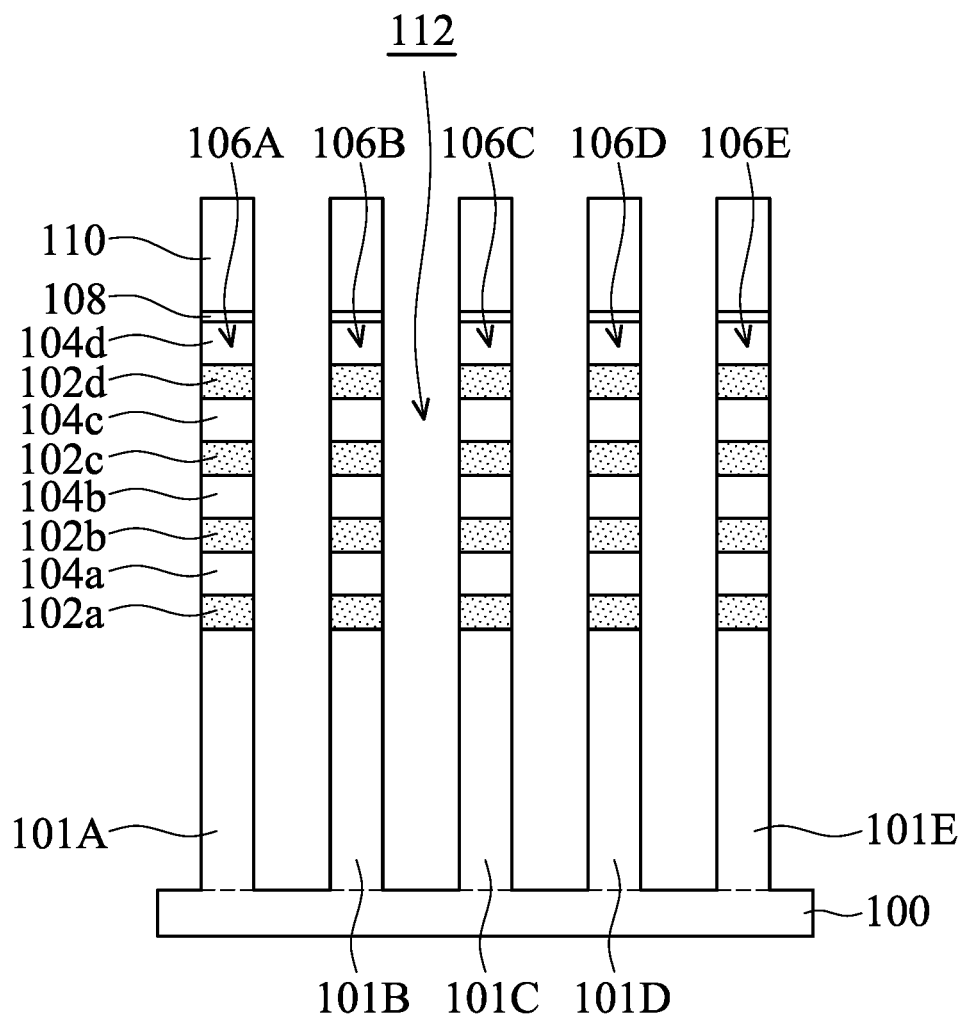

Afterwards, hard mask elements are formed over the semiconductor stack to assist in a subsequent patterning of the semiconductor stack. One or more photolithography processes and one or more etching processes are used to pattern the semiconductor stack into fin structures 106A, 106B, 106C, 106D, and 106E, as shown in FIG. 2B in accordance with some embodiments. The fin structures 106A-106E may be patterned by any suitable method. For example, the fin structures 106A-106E may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

The semiconductor stack is partially removed to form trenches 112, as shown in FIG. 2B. Each of the fin structures 106A-106E may include portions of the semiconductor layers 102a-102d and 104a-104d and semiconductor fins 101A, 101B, 101C, 101D, and 101E. The semiconductor substrate 100 may also be partially removed during the etching process that forms the fin structures 106A-106E. Protruding portions of the semiconductor substrate 100 that remain form the semiconductor fins 101A-101E.

Each of the hard mask elements may include a first mask layer 108 and a second mask layer 110. The first mask layer 108 and the second mask layer 110 may be made of different materials. In some embodiments, the first mask layer 108 is made of a material that has good adhesion to the semiconductor layer 104d. The first mask layer 108 may be made of silicon oxide, germanium oxide, silicon germanium oxide, one or more other suitable materials, or a combination thereof. The second mask layer 110 may be made of silicon nitride, silicon oxynitride, silicon carbide, one or more other suitable materials, or a combination thereof.

Figure 1B:
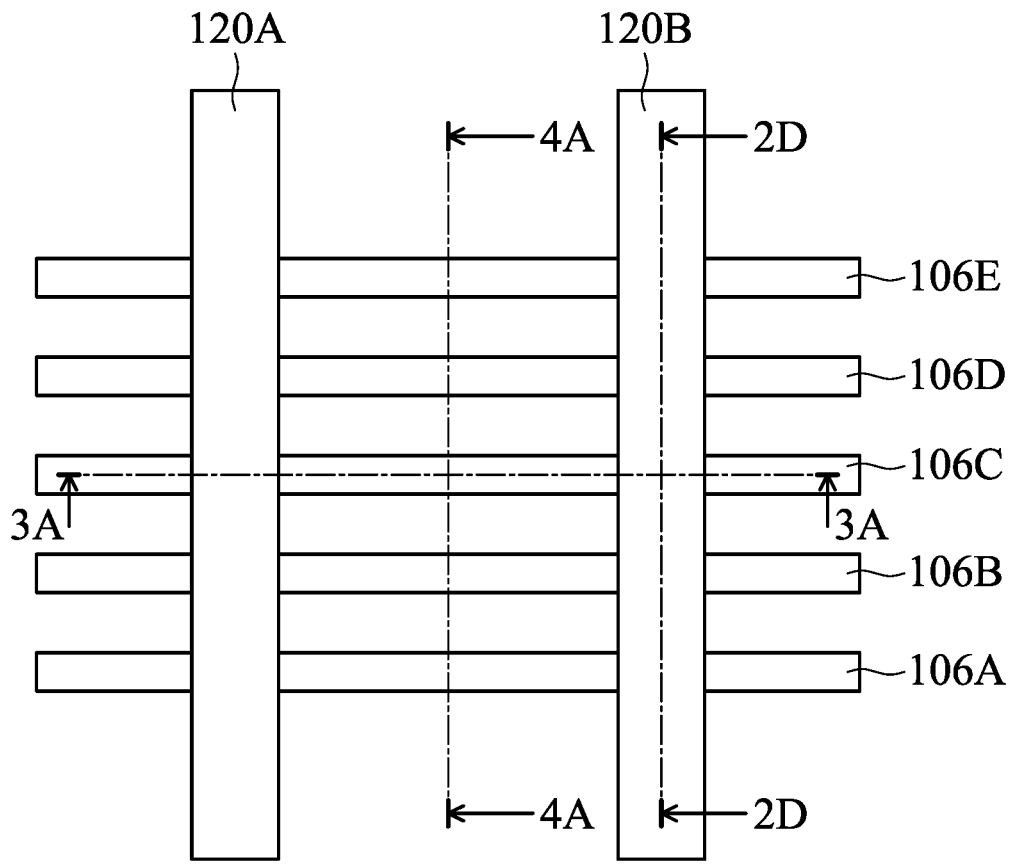

FIGS. 1A-1B are top views of various stages of a process for forming a portion of a semiconductor device structure, in accordance with some embodiments. In some embodiments, the fin structures 106A-106E are oriented lengthwise. In some embodiments, the extending directions of the fin structures 106A-106E are substantially parallel to each other, as shown in FIG. 1A. In some embodiments, FIG. 2B is a cross-sectional view of the structure taken along the line 2B-2B in FIG. 1A.

Figure 2C:
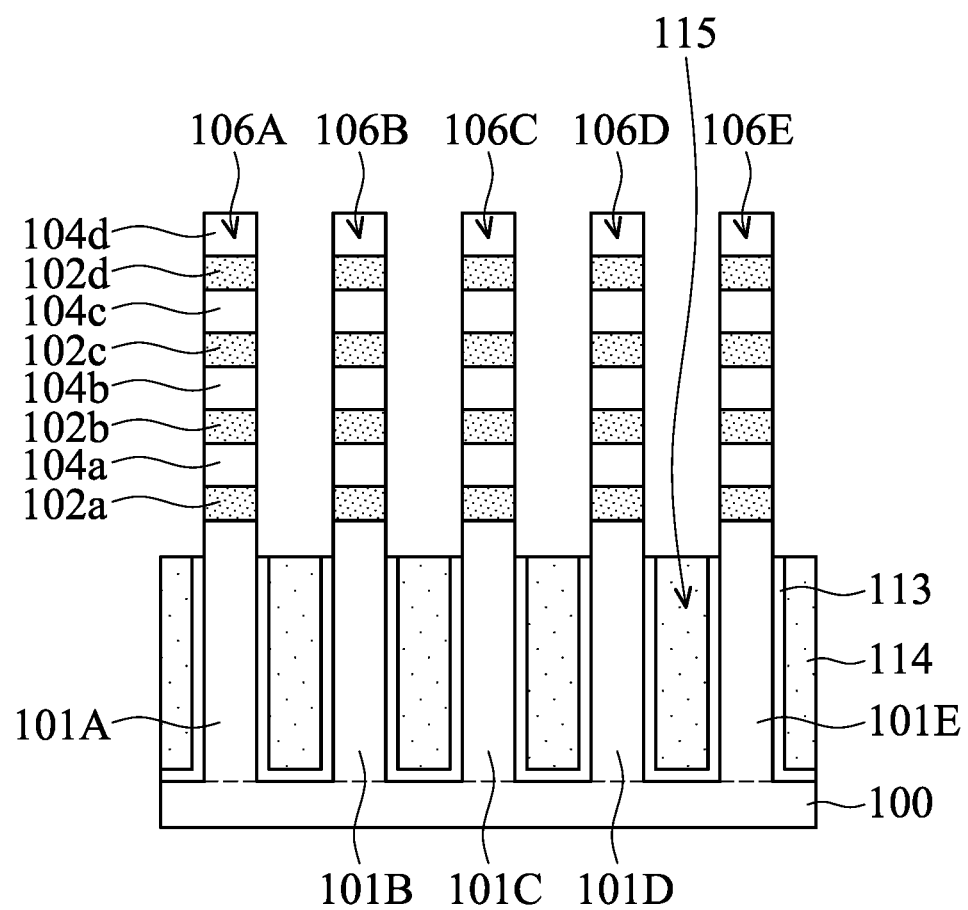

As shown in FIG. 2C, an isolation structure 115 is formed to surround lower portions of the fin structures 106A-106E, in accordance with some embodiments. In some embodiments, the isolation structure 115 includes dielectric fillings 114 and a liner layer 113 that is adjacent to the semiconductor fins 101A-101E. In some embodiments, one or more dielectric layers are deposited over the fin structures 106A-106E and the semiconductor substrate 100 to overfill the trenches 112. The dielectric layers may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof. Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106A-106E protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102a that functions as a sacrificial layer.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
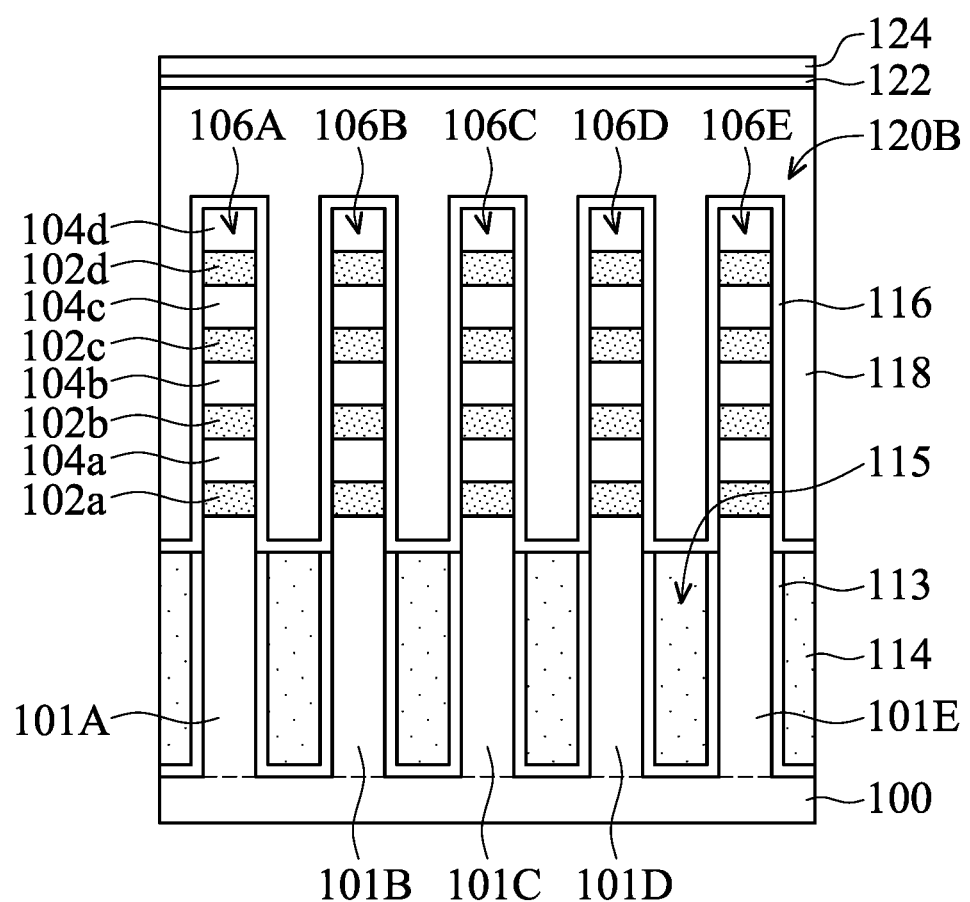
Figures 3C, 3D:
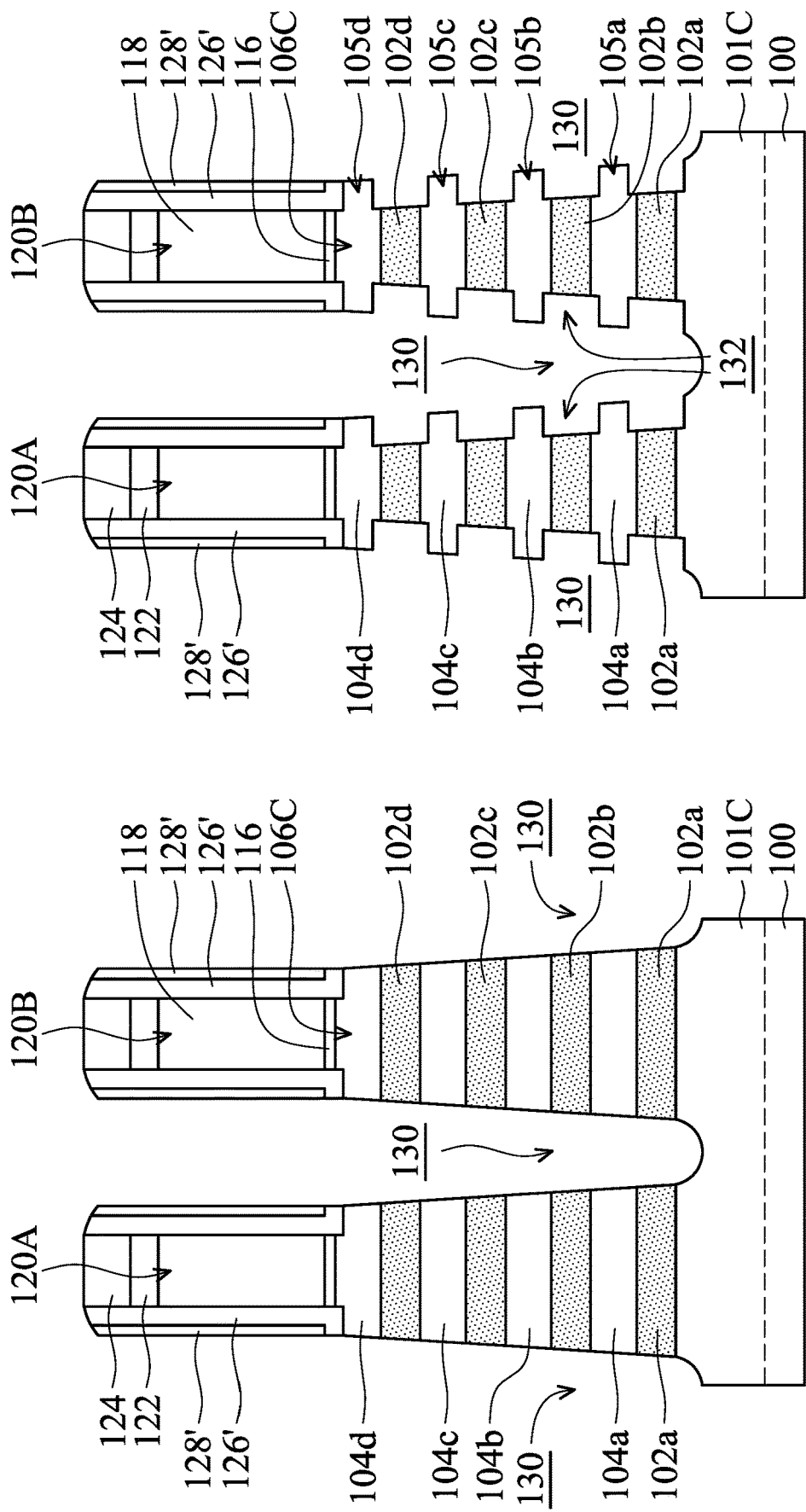

Afterwards, dummy gate stacks 120A and 120B are formed to extend across the fin structures 106A-106E, as shown in FIG. 1B in accordance with some embodiments. In some embodiments, FIG. 2D is a cross-sectional view of the structure taken along the line 2D-2D in FIG. 1B. FIGS. 3A-3K are cross-sectional views of various stages of a process for forming a portion of a semiconductor device structure, in accordance with some embodiments. In some embodiments, FIG. 3A is a cross-sectional view of the structure taken along the line 3A-3A in FIG. 1B. FIGS. 4A-4E are cross-sectional views of various stages of a process for forming a portion of a semiconductor device structure, in accordance with some embodiments. In some embodiments, FIG. 4A is a cross-sectional view of the structure taken along the line 4A-4A in FIG. 1B.

As shown in FIGS. 1B, 2D, and 3A, the dummy gate stacks 120A and 120B are formed to partially cover and to extend across the fin structures 106A-106E, in accordance with some embodiments. In some embodiments, the dummy gate stacks 120A and 120B wraps around the fin structures 106A-106E. As shown in FIG. 2D, the dummy gate stack 120B extends across and is wrapped around the fin structures 106A-106E. As shown in FIGS. 1B and 4A, other portions of the fin structures 106A-106E are exposed without being covered by the dummy gate stack 120A or 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106A-106E. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B that include the dummy gate dielectric layer 116 and the dummy gate electrodes 118.

As shown in FIGS. 3B and 4B, spacer layers 126 and 128 are afterwards deposited over the dummy gate stacks 120A and 120B, the fin structures 106A-106E, and the isolation structures 115, in accordance with some embodiments. The spacer layers 126 and 128 extend along the tops and sidewalls of the dummy gate stacks 120A and 120B, as shown in FIG. 3B. The spacer layers 126 and 128 extend along the tops and sidewalls of the fin structures 106A-106E, as shown in FIG. 4B.

The spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

Figures 4A, 4B:
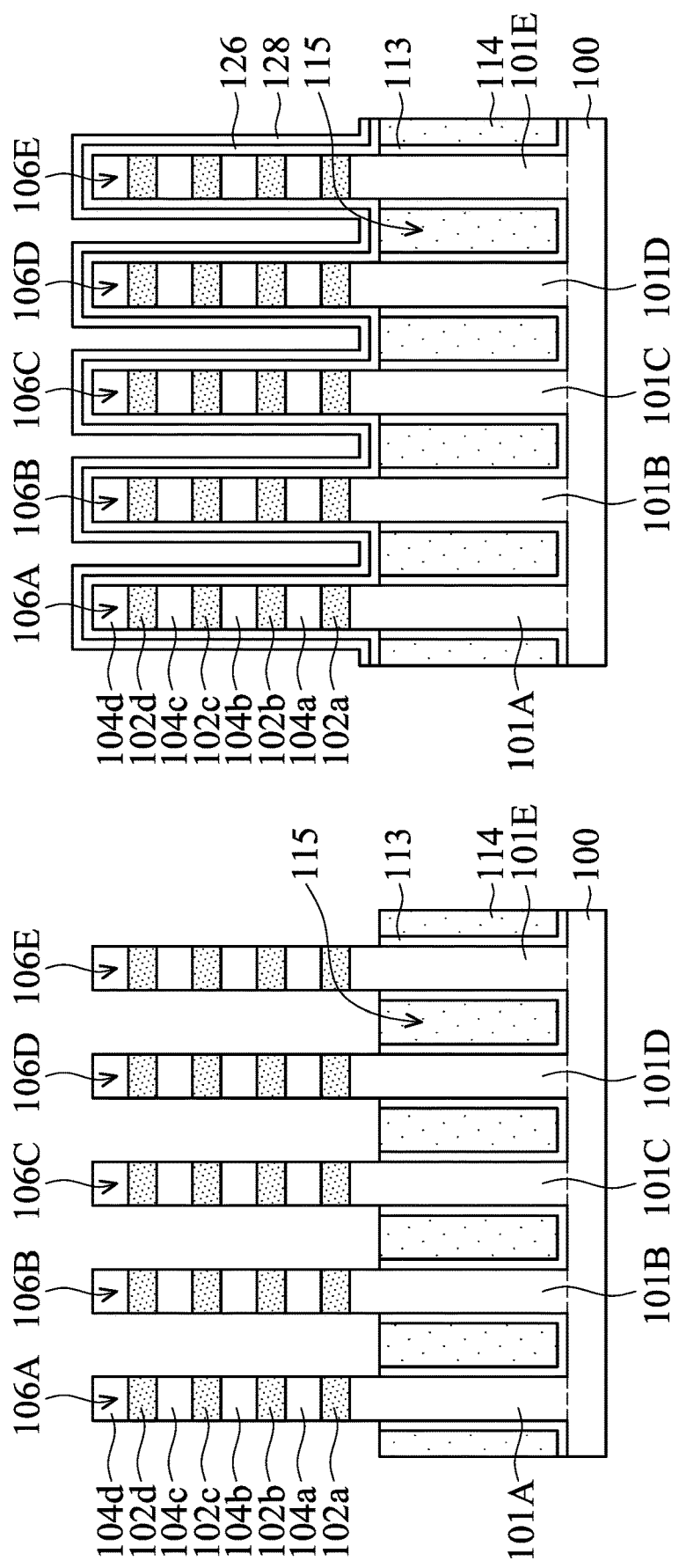
Figures 4C, 4D:
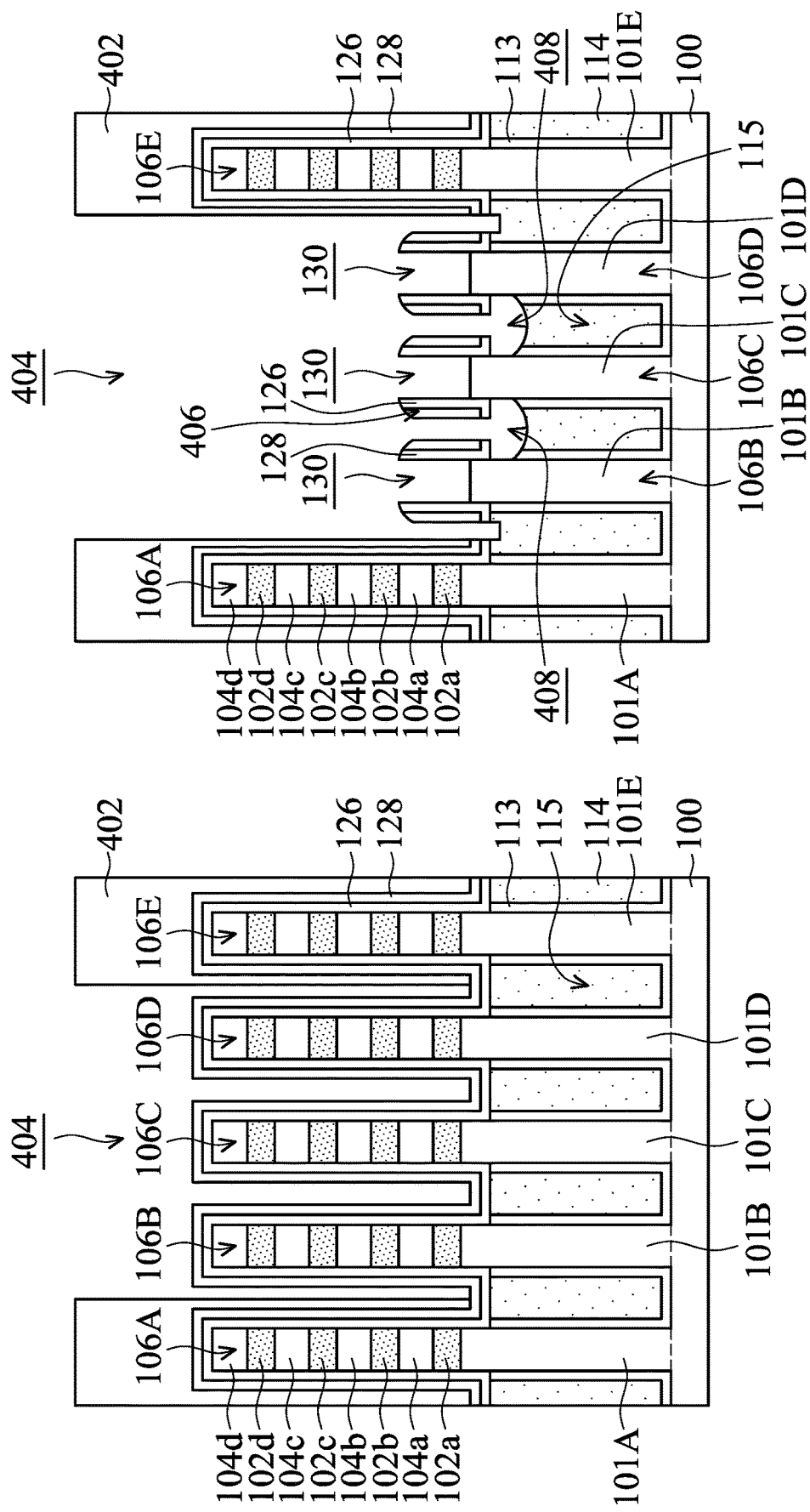

As shown in FIG. 4C, a mask element 402 is formed to cover some of the fin structures 106A-106E, in accordance with some embodiments. In some embodiments, the mask element 402 covers the fin structures 106A and 106E. The mask element 402 has an opening 404 that exposes the fin structures 106B-106D. The mask element 402 may be a patterned photoresist layer or another suitable layer. The mask element 402 may function as an etching mask during a subsequent etching process. In some embodiments, different epitaxial structures are designed to be formed over the fin structures 106A and 106E. Therefore, the fin structures 106A and 106E are covered by the mask element 402 without being exposed. Alternatively, in some other embodiments, no epitaxial structure is designed to be formed over the fin structures 106A and 106E. Therefore, the fin structures 106A and 106E are covered by the mask element 402 without being exposed.

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

As shown in FIG. 3C, the fin structure 106C is partially removed to form recesses 130, in accordance with some embodiments. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, each of the recesses 130 penetrates into the fin structure 106C. In some embodiments, the recesses 130 further extend into the semiconductor fin 101C, as shown in FIG. 3C. In some embodiments, the spacer elements 126' and 128' and the recesses 130 are simultaneously formed using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104*d*) is shorter than a lower semiconductor layer (such as the semiconductor layer 104*b*).

However, embodiments of the disclosure have many variations. In some other embodiments, the recesses 130 have substantially vertical sidewalls. In these cases, due to the profile of the recesses 130, an upper semiconductor layer (such as the semiconductor layer 104*d*) is substantially as wide as a lower semiconductor layer (such as the semiconductor layer 104*b*).

In some embodiments, the etching process used for forming the spacer elements 126' and 128' also partially remove the fin structures 106B-106D and the spacer layers 126 and 128 over the fin structures 106B-106D, as shown in FIG. 4D. As a result, the recesses 130 are formed above each of the fin structures 106B-106D that are not covered by the mask element 402. The remaining portions of the spacer layers 126 and 128 form supporting elements 406. The supporting elements 406 may be used to prevent neighboring epitaxial structures (that will be formed later) from merging together.

In some embodiments, the isolation structure 115 is partially removed, as shown in FIG. 4D. Recesses 408 are formed over the portions of the isolation structure 115 between the semiconductor fins 101B and 101C and between the semiconductor fins 101C and 101D. In some embodiments, the partial removal of the fin structures 106B, 106C, and 106D and the partial removal of the isolation structure 115 are performed simultaneously using the same etching process. Each of the recesses 408 may have a vertical depth that is, for example, in a range from about 30 nm to about 50 nm. Each of the recesses 408 may have a lateral distance that is, for example, in a range from about 7 nm to about 13 nm.

In some embodiments, the reaction gas mixture used in the etching process mentioned above includes a polymer-generating gas and an etching gas. The polymer-generating gas may include $CHF_3$, $CH_3F$, $C_4F_6$, $C_4F_8$, one or more other suitable gases, or a combination thereof. The etching gas may include $CF_4$ or another suitable gas. The reaction gas mixture may further include dilute gas such as Ar, $N_2$, He, $H_2$, one or more other suitable gases, or a combination thereof.

The etching gas may be used to generate etchant plasma over the structure shown in FIG. 4D. A bombard bias may be provided to direct the plasma etchant. The bombard bias may be in a range from about 100 V to about 500 V.

The polymer-generating gas may be used to generate carbon-containing plasma that may form a protection layer over the structure shown in FIG. 4D. Due to the mask element 402, the protection layer may be formed at a greater rate in the regions near the mask element 402 while the protection layer may be formed at a lower rate in the region away from the mask element 402. As a result, the protection layer near the mask element 402 may be thicker than the protection layer away from the mask element 402. The protection layer near the mask element 402 may thus provide more protection to the portion of the isolation structure 115 near the mask element 402 during the bombardment of the etchant plasma.

As shown in FIG. 4D, the portion of the isolation structure 115 near the mask element 402 is slightly etched while the portion of the isolation structure 115 away from the mask element 402 is etched at a greater rate. As a result, the recesses 408 are formed over the portions of the isolation structure 115 between the semiconductor fins 101B and 101C and between the semiconductor fins 101C and 101D, as shown in FIG. 4D. In some embodiments, the recesses 408 expose side surfaces of the semiconductor fins 101B, 101C, and 101D.

In some embodiments, the opposite side surfaces of the semiconductor fin 101C are exposed by the recesses 408, as shown in FIG. 4D. In some embodiments, a first side surface of the semiconductor fin 101B (or 101D) is exposed by the recess 408 while an opposite side surface of the semiconductor fin 101B (or 101D) is covered by the isolation structure 115, as shown in FIG. 4D.

As shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (that function as, for example, source/drain structures) from being damaged during a subsequent process for removing the sacrificial layers 102b-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fin 101C originally covered by the insulating layer 134 are exposed by the recesses 130, as shown in FIG. 3F. The edges of the semiconductor layers 104a-104d are exposed by the recesses 130, as shown in FIG. 3F.

Figure 3G:
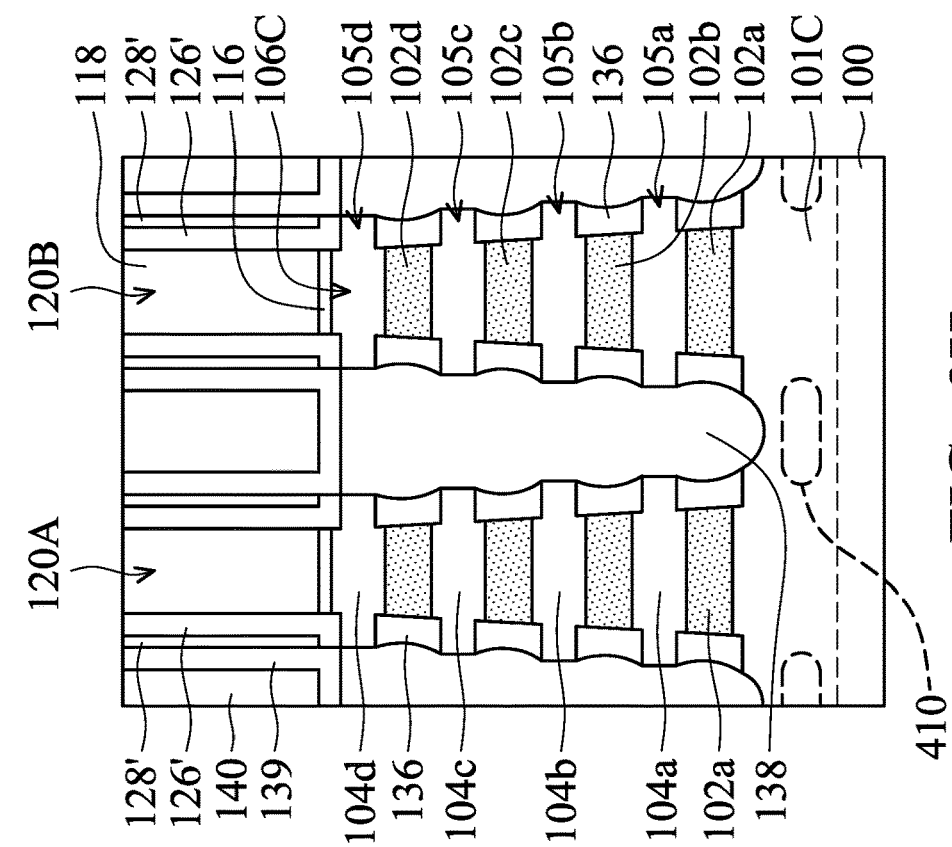

As shown in FIGS. 3G and 4E, epitaxial structures 138 are formed, in accordance with some embodiments. In some embodiments, the epitaxial structures 138 fill the recesses 130, as shown in FIGS. 3G and 4E. In some other embodiments, the epitaxial structures 138 overfill the recesses 130. In these cases, the top surfaces of the epitaxial structures 138 may be higher than the top surface of the dummy gate dielectric layer 116. In some other embodiments, the epitaxial structures 138 partially fill the recesses 130.

In some embodiments, the epitaxial structures 138 connect to the semiconductor layers 104a-104d. Each of the semiconductor layers 104a-104d is sandwiched between the epitaxial structures 138. In some embodiments, the epitaxial structures 138 are p-type doped regions. The epitaxial structures 138 may include epitaxially grown silicon germanium (SiGe), epitaxially grown silicon, or another suitable epitaxially grown semiconductor material.

However, embodiments of the disclosure are not limited thereto. In some other embodiments, the epitaxial structures 138 are n-type doped regions. The epitaxial structures 138 may include epitaxially grown silicon, epitaxially grown silicon carbide (SiC), epitaxially grown germanium, or another suitable epitaxially grown semiconductor material.

As shown in FIG. 4E, embedded epitaxial structures 410 are formed on the side surfaces of the semiconductor fins 101B, 101C, and 101D that are originally exposed by the recesses 408, in accordance with some embodiments. In some embodiments, the epitaxial structures 138 and the embedded epitaxial structures 410 are simultaneously formed. In some embodiments, the epitaxial structures 138 and the embedded epitaxial structures 410 are simultaneously grown using the same epitaxial growth process.

As shown in FIG. 3G, the embedded epitaxial structures 410 behind the semiconductor fin 101C are illustrated in dotted lines. In some cases, the embedded epitaxial structures behind the semiconductor fin may be observed in a TEM picture. As shown in FIGS. 3G and 4E, one of the embedded epitaxial structures 410 is separated from the bottom of the respective epitaxial structure 138 thereabove by a distance H, in accordance with some embodiments. The distance H may be in a range from about 2 nm to about 25 nm. As shown in FIG. 4E, the embedded epitaxial structures 410 may have a length d. The length d may be in a range from about 5 nm to about 20 nm.

Figure 8:
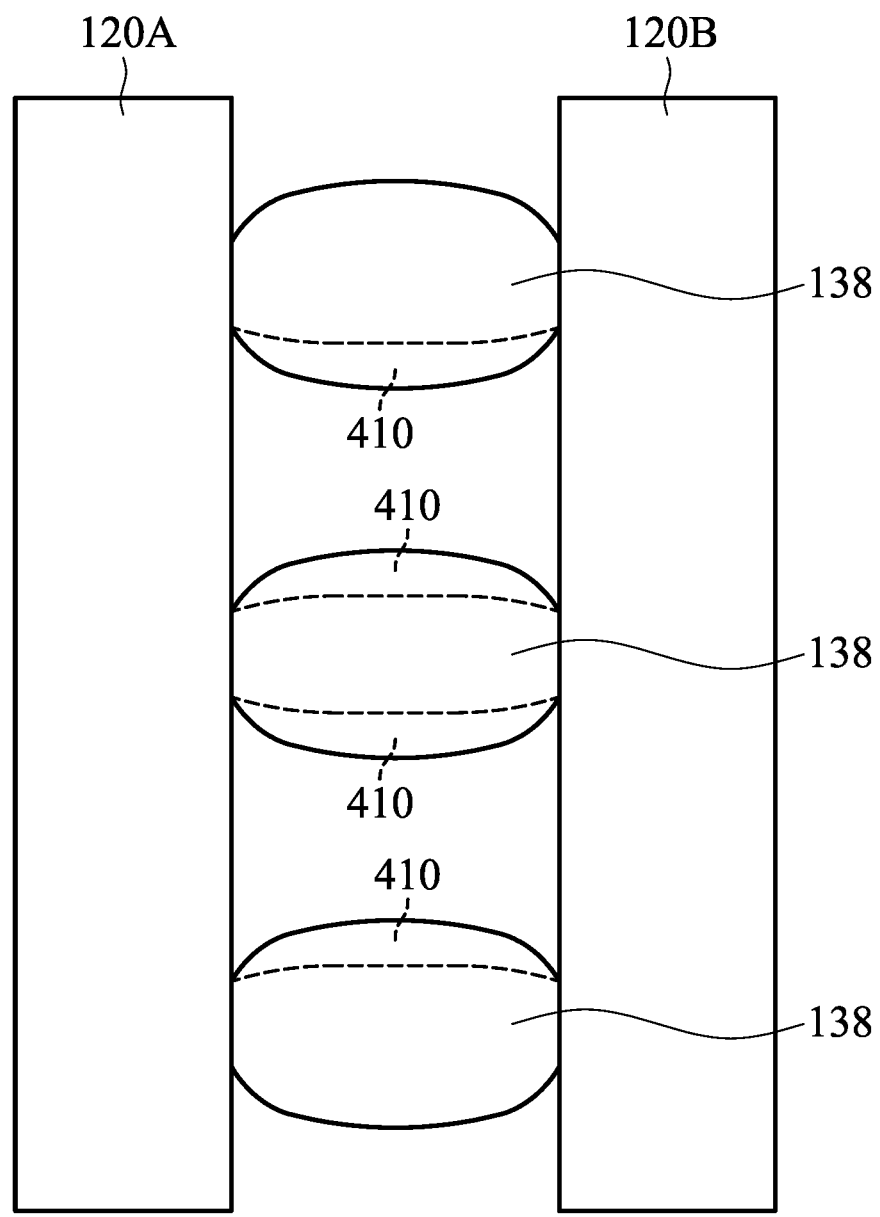
FIG. 8 is a top view of a portion of a semiconductor device structure, in accordance with some embodiments.

FIG. 8 is a top view of a portion of a semiconductor device structure, in accordance with some embodiments. In some embodiments, FIG. 8 is a top view showing a portion of the structure illustrated in FIGS. 3G and 4E. The embedded epitaxial structures 410 are illustrated in dotted lines in FIG. 8 since they are covered by the epitaxial structures 138 thereabove.

The profiles of the embedded epitaxial structures 410 may be varied and/or fine-tuned by modifying the profiles of the recesses 408 and/or by modifying the epitaxial growth process of the embedded epitaxial structures 410. FIGS. 9A, 9B, 9C, and 9D are side views each showing an embedded epitaxial structure of a semiconductor device structure, in accordance with some embodiments.

Figure 9A:
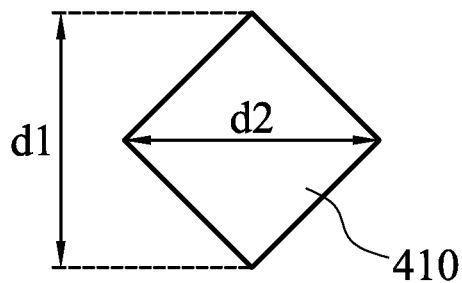
FIGS. 9A, 9B, 9C, and 9D are side views each showing an embedded epitaxial structure of a semiconductor device structure, in accordance with some embodiments.
Figure 9B:
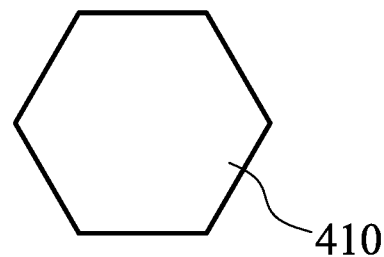
Figure 9C:
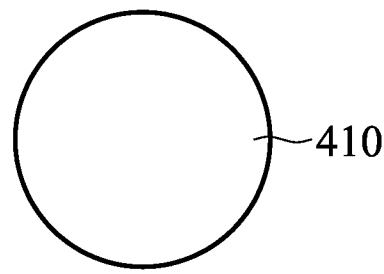
Figure 9D:
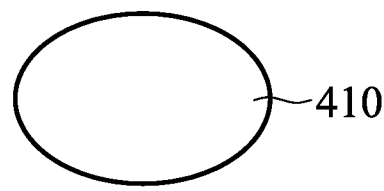

In some embodiments, the embedded epitaxial structure 410 has a square profile or a square-like profile, as shown in FIG. 9A. In some other embodiments, the embedded epitaxial structure 410 has a rectangle profile or a rectangle-like profile. As shown in FIG. 9A, the embedded epitaxial structure 410 may have a first length d1 and a second length d2. The first length d1 may be in a range from about 5 nm to about 20 nm. The second length may be in a range from about 5 nm to about 20 nm. In some embodiments, the embedded epitaxial structure 410 has a hexagon profile or a hexagon-like profile, as shown in FIG. 9B. In some embodiments, the embedded epitaxial structure 410 has a circle profile or a circle-like profile, as shown in FIG. 9C. In some embodiments, the embedded epitaxial structure 410 has an oval profile or an oval-like profile, as shown in FIG. 9D.

In some embodiments, the epitaxial structures 138 and the embedded epitaxial structures 410 are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138 and the embedded epitaxial structures 410 involves one or more etching processes that are used to fine-tune the shapes of the epitaxial structures 138 and the embedded epitaxial structures 410.

In some embodiments, the epitaxial structures 138 and the embedded epitaxial structures 410 are doped with the same type of dopant. In some embodiments, the epitaxial structures 138 and the embedded epitaxial structures 410 are doped with the same dopant. In some embodiments, the epitaxial structures 138 and the embedded epitaxial structures 410 are doped with one or more suitable p-type dopants. For example, the epitaxial structures 138 and the embedded epitaxial structures 410 are SiGe source/drain features or Si source/drain features that are doped with boron (B), gallium (Ga), indium (In), or another suitable dopant. In some other embodiments, the epitaxial structures 138 and the embedded epitaxial structures 410 are doped with one or more suitable n-type dopants. For example, the epitaxial structures 138 and the embedded epitaxial structures 410 are Si source/drain features doped with phosphor (P), antimony (Sb), or another suitable dopant.

In some embodiments, each of the epitaxial structures 138 has a first region and a second region over the first region. The second region may have a greater dopant concentration than that of the first region. In some embodiments, the dopant concentration of the embedded epitaxial structures 410 is substantially equal to or similar to the dopant concentration of the second regions of the epitaxial structures 138. In some embodiments, the average dopant concentration of the entirety of the embedded epitaxial structure 410 is greater than the average dopant concentration of the entirety of the epitaxial structure 138.

In some embodiments, the epitaxial structures 138 and the embedded epitaxial structures 410 are doped in-situ during their epitaxial growth. The initial reaction gas mixture for forming the epitaxial structures 138 and the embedded epitaxial structures 410 contains dopants. In some other embodiments, the epitaxial structures 138 and the embedded epitaxial structures 410 are not doped during the growth of the epitaxial structures 138 and the embedded epitaxial structures 410. Instead, after the formation of the epitaxial structures 138 and the embedded epitaxial structures 410, the epitaxial structures 138 and the embedded epitaxial structures 410 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138 and the embedded epitaxial structures 410 are further exposed to one or more annealing processes to activate the dopants. For example, a rapid thermal annealing process is used.

The embedded epitaxial structures 410 may function as an extra dopant resource to enhance the device current. The embedded epitaxial structures 410 may also function as an extra stressor that applies stress on channel structures that will be formed later. With the embedded epitaxial structures 410, the doping concentration of the epitaxial structures 138 may be doped with a lower dopant concentration, which may help to reduce the risk of current leakage. With the embedded epitaxial structures 410, the depth of the recesses 130 may be smaller since a smaller epitaxial structure 138 may be acceptable. The recesses 130 are thus prevented from reaching an anti-punch-through (APT) region formed below the epitaxial structures 138. The risk of current leakage is therefore prevented or reduced.

As shown in FIG. 4E, the embedded epitaxial structures 410 are adjacent to the semiconductor fin 101B, 101C, or 101D, in accordance with some embodiments. In some embodiments, the embedded epitaxial structures 410 are in direct contact with the semiconductor fin 101B, 101C, or 101D. In some embodiments, the embedded epitaxial structures 410 are separated from the corresponding epitaxial structure 138 by the corresponding semiconductor fin 101B, 101C, or 101D.

In some embodiments, each of the embedded epitaxial structures 410 is between the isolation structure 115 and the corresponding supporting element 406. In some embodiments, the each of the embedded epitaxial structures 410 is in direct contact with the corresponding supporting element 406. In some other embodiments, the embedded epitaxial structures 410 are not in direct contact with the supporting elements 406. Some of the embedded epitaxial structures 410 may be separated from the corresponding supporting element 406 by a gap.

As shown in FIG. 4E, the semiconductor fin 101C has a protruding portion protrudes from a top surface of the isolation structure 115 adjacent to the semiconductor fin 101C. The protruding portion of the semiconductor fin 101C has a first side surface and a second side surface opposite the first side surface. In some embodiments, the first side surface and the second side surface of the semiconductor fin 101C are in direct contact with a first embedded epitaxial structure (such as the left side embedded epitaxial structure 410) and a second embedded epitaxial structure (such as the right side embedded epitaxial structure 410), respectively.

As shown in FIG. 4E, the semiconductor fin 101B (or 101D) has a protruding portion protrudes from a top surface of the isolation structure 115 adjacent to the semiconductor fin 101B (or 101D). The protruding portion of the semiconductor fin 101B (or 101D) has a first side surface and a second side surface opposite the first side surface. In some embodiments, the first side surface and the second side surface of the semiconductor fin 101B (or 101D) are in direct contact with the embedded epitaxial structure 410 and the isolation structure 115, respectively. In some embodiments, the second side surface of the semiconductor fin 101B (or 101D) is covered by the isolation structure 115.

In some embodiments, each of epitaxial structures 138 is larger than each of the embedded epitaxial structures 410. In some embodiments, each of the epitaxial structures 138 overlaps the respective embedded epitaxial structure 410 thereunder, as shown in FIG. 4E. In some embodiments, one of the epitaxial structures 138 (such as the embedded epitaxial structure 410 over the semiconductor fin 101B or 101D) vertically overlaps one embedded epitaxial structure 410. In some embodiments, one of the epitaxial structures 138 (such as embedded epitaxial structure 410 over the semiconductor fin 101C) vertically overlaps two opposite embedded epitaxial structure 410, as shown in FIG. 4E.

Figure 3H:
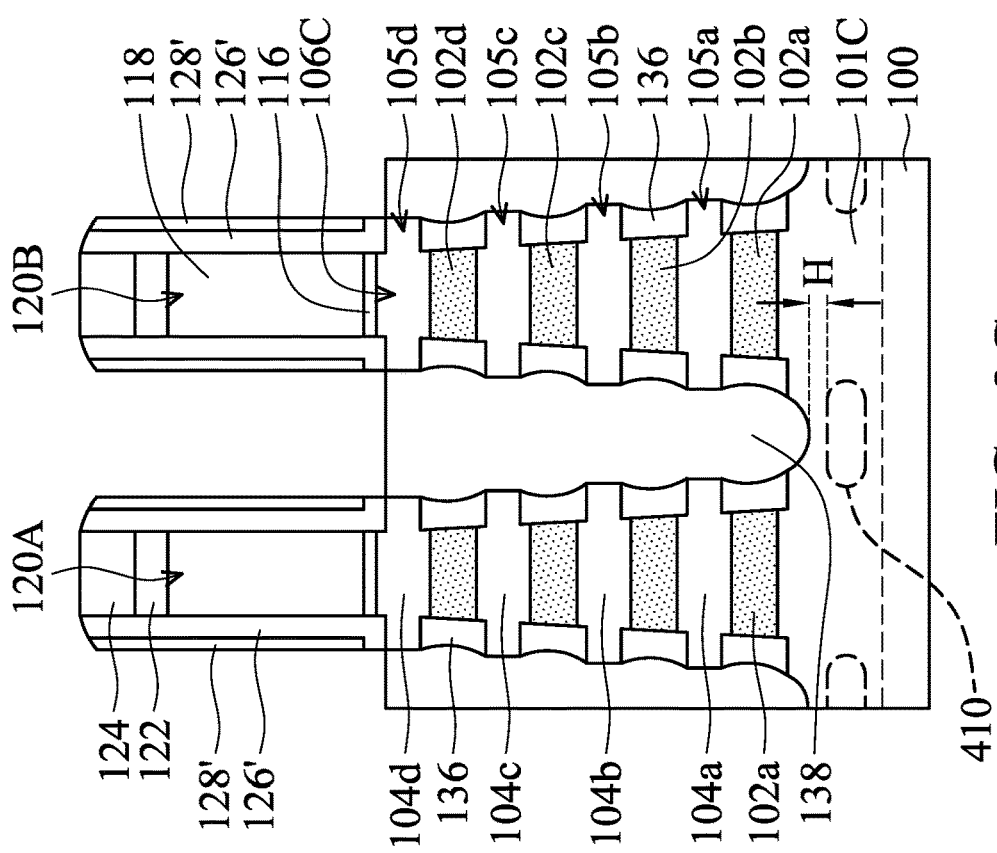

As shown in FIG. 3H, a contact etch stop layer 139 and a dielectric layer 140 are formed to cover the epitaxial structures 138, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited over the structure shown in FIG. 3G. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIG. 3H. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially coplanar.

Figures 3I, 3J:
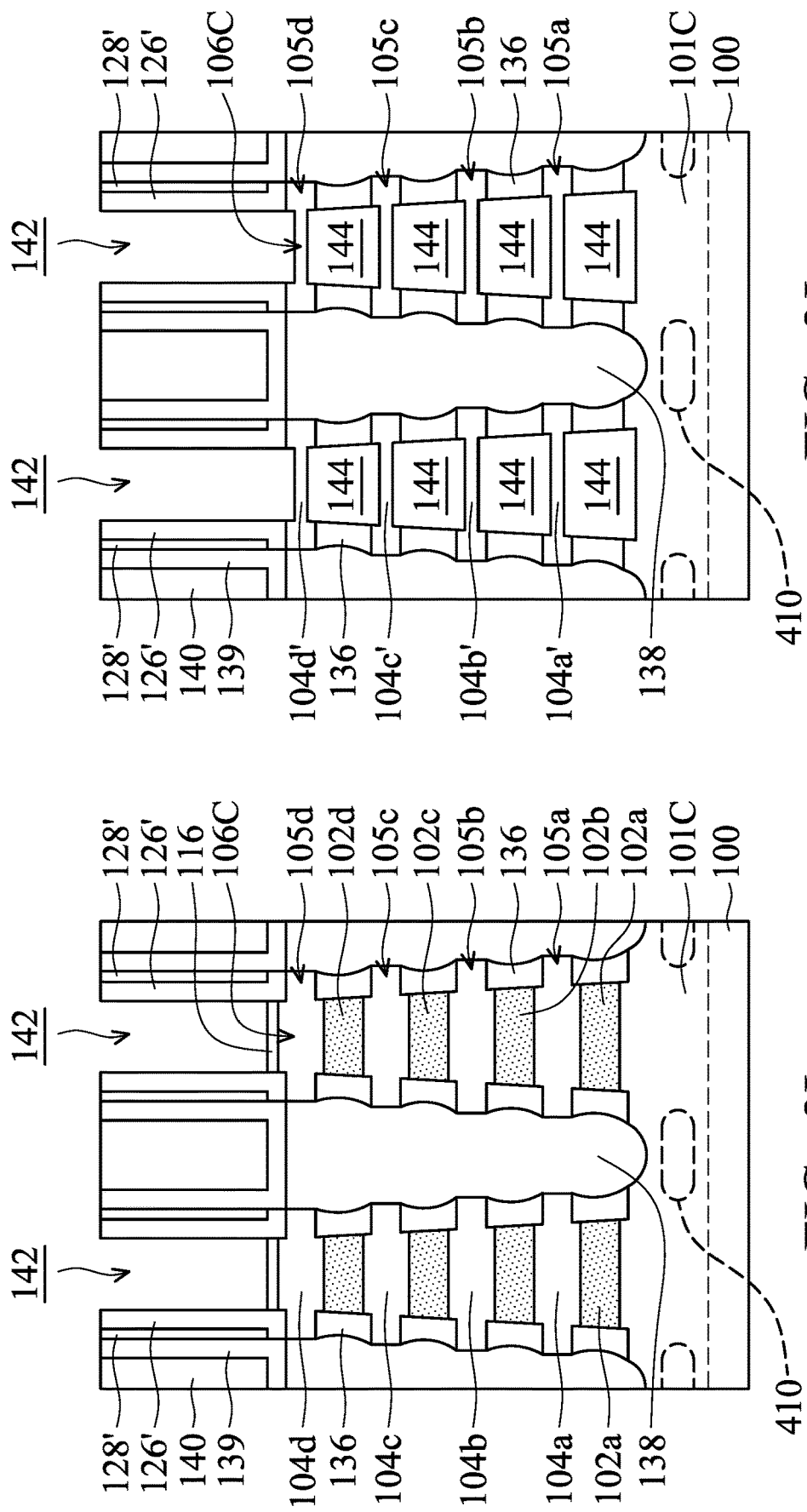

As shown in FIG. 3I, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

As shown in FIG. 3J, the dummy gate dielectric layer 116 and the semiconductor layers 102a-102d (that function as sacrificial layers) are removed, in accordance with some embodiments. In some embodiments, one or more etching processes are used to remove the dummy gate dielectric layer 116 and the semiconductor layers 102a-102d. As a result, recesses 144 are formed, as shown in FIG. 3J.

Due to high etching selectivity, the semiconductor layers 104a-104d are slightly (or substantially not) etched. The remaining portions of the semiconductor layers 104a-104d form multiple semiconductor nanostructures 104a'-104d'. The semiconductor nanostructures 104a'-104d' are constructed by or made up of the remaining portions of the semiconductor layers 104a-104d. The semiconductor nanostructures 104a'-104d' suspended over the semiconductor fin 101C may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge portions 105a-105d since the edge portions 105a-105d are surrounded by other elements and thus are prevented from being reached and etched by the etchant.

After the removal of the semiconductor layers 102a-102d (that function as sacrificial layers), the recesses 144 are formed. The recesses 144 connect to the trench 142 and surround each of the semiconductor nanostructures 104a'-104d'. As shown in FIG. 3J, even if the recesses 144 between the semiconductor nanostructures 104a'-104d' are formed, the semiconductor nanostructures 104a'-104d' remain being held by the epitaxial structures 138. Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138 from being etched or damaged. The quality and reliability of the semiconductor device structure are improved.

Figure 3K:
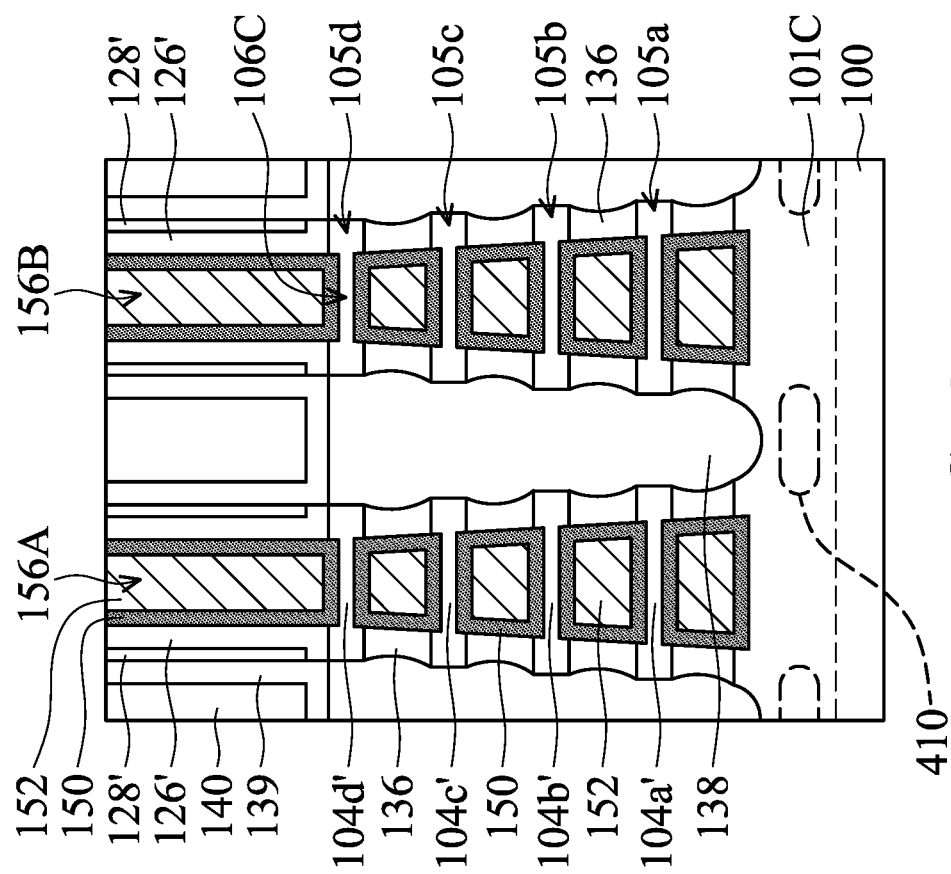

As shown in FIG. 3K, metal gate stacks 156A and 156B are formed to fill the trenches 142, in accordance with some embodiments. The metal gate stacks 156A and 156B further extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'.

The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some other embodiments, the work function layer is used for forming an NMOS device. The work function layer is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function layer is an aluminum-containing layer. The aluminum-containing layer may be made of or include TiAlC, TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3K.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Many variations and/or modifications can be made to embodiments of the disclosure. FIG. 5 is a cross-sectional view of an intermediate stage of a process for forming a portion of a semiconductor device structure, in accordance with some embodiments. In some embodiments, the recesses 130 extend deeper than the bottom surfaces of the supporting elements 406. As a result, the epitaxial structures 138 that are formed later may have bottom surfaces lower than the bottom surfaces of the supporting elements 406, as shown in FIG. 5. In some embodiments, the epitaxial structures 138 are in direct contact with the embedded epitaxial structures 410. In some embodiments, the epitaxial structure 138 over the semiconductor fin 101C is in direct contact with two embedded epitaxial structures 410 beside the semiconductor fin 101C. In some embodiments, the epitaxial structure 138 over the semiconductor fin 101B (or 101D) is in direct contact with only one embedded epitaxial structure 410 beside the semiconductor fin 101B (or 101D).

Figures 6, 7:
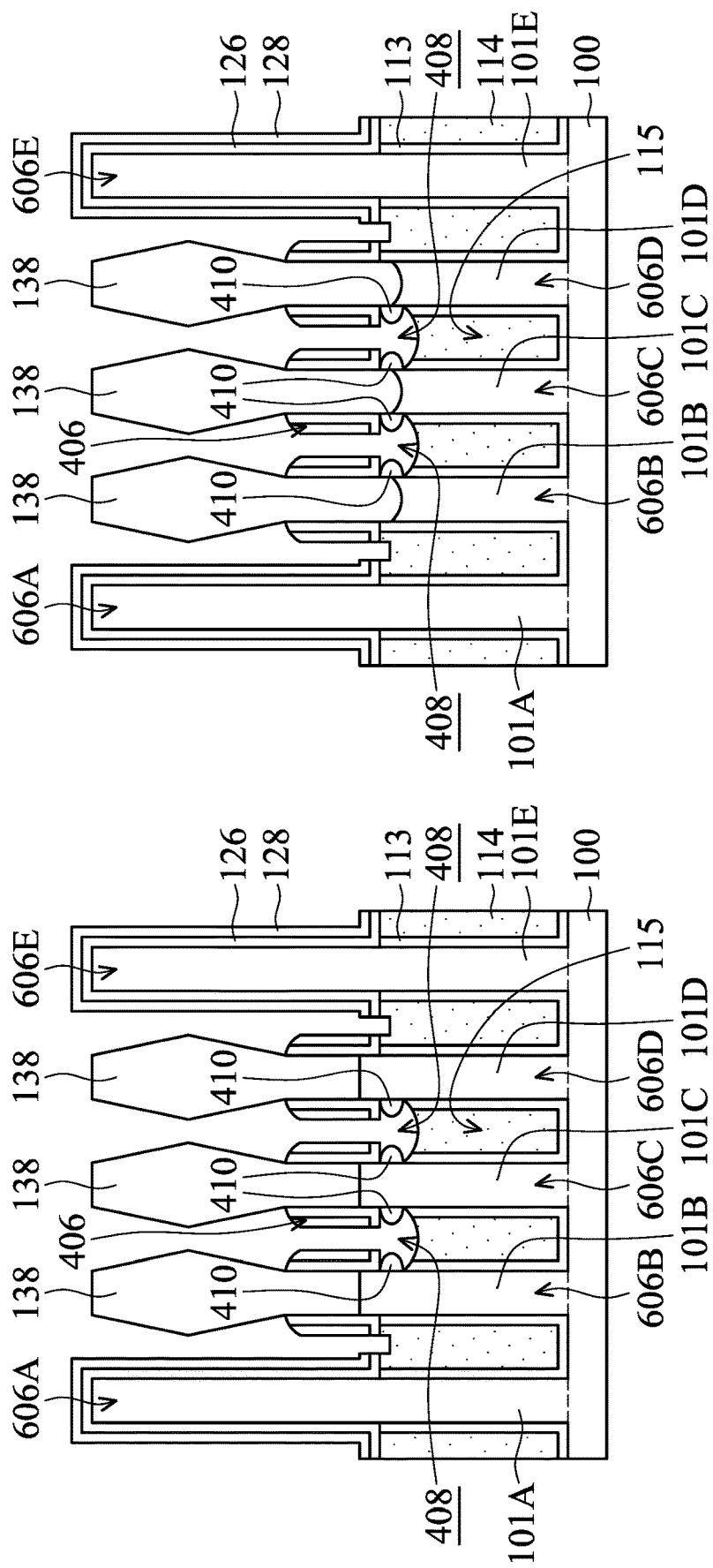
FIG. 6 is a cross-sectional view of an intermediate stage of a process for forming a portion of a semiconductor device structure, in accordance with some embodiments.
FIG. 7 is a cross-sectional view of an intermediate stage of a process for forming a portion of a semiconductor device structure, in accordance with some embodiments.

Many variations and/or modifications can be made to embodiments of the disclosure. Embodiments of the disclosure may be applied to both the GAA device and the FinFET device. FIG. 6 is a cross-sectional view of an intermediate stage of a process for forming a portion of a semiconductor device structure, in accordance with some embodiments. FIG. 6 shows a portion of a FinFET device.

As shown in FIG. 6, fin structures 606A-606E are formed over the semiconductor substrate 100. Similar to the fin structures 106A and 106E shown in FIG. 4E, the fin structures 606A and 606E are covered by the spacer layers 126 and 128. In some embodiments, the fin structures 606A and 606E include semiconductor fins 101A and 101E that are not recessed. In some embodiments, the semiconductor fins 101B, 101C, and 101D of the fin structures 606B, 606C, and 606D are recessed to be lower than the tops of the supporting elements 406, as shown in FIG. 6. The epitaxial structures 138 are formed on the fin structures 606B, 606C, and 606D to function as source/drain structures. Other portions of the fin structures 606B, 606C, and 606D covered by the dummy gate stacks 120A and 120B are not recessed and may function as channel structures. In some embodiments, similar to the embodiments illustrated in FIG. 4E, each of the epitaxial structures 138 are separated from the embedded epitaxial structures 410 by the fin structures 606B, 606C, or 606D.

Many variations and/or modifications can be made to embodiments of the disclosure. FIG. 7 is a cross-sectional view of an intermediate stage of a process for forming a portion of a semiconductor device structure, in accordance with some embodiments. Similar to the embodiments illustrated in FIG. 6, FIG. 7 shows a portion of a FinFET device. In some embodiments, similar to the embodiments illustrated in FIG. 5, each of the epitaxial structures 138 is in direct contact with one or two respective embedded epitaxial structures 410, as shown in FIG. 7.

Many variations and/or modifications can be made to embodiments of the disclosure. FIGS. 10A-10D are cross-sectional views of various stages of a process for forming a portion of a semiconductor device structure, in accordance with some embodiments.

As shown in FIG. 10A, a structure the same as or similar to the structure shown in FIG. 3C is formed. Afterwards, similar to the embodiments illustrated in FIG. 3D, the semiconductor layers 102a-102d are laterally etched to form the recesses 132, as shown in FIG. 10B in accordance with some embodiments. As shown in FIG. 10B, the recesses 132 may have rounded sidewalls. In some embodiments, the edge elements 105a-105d have rounded terminals, as shown in FIG. 10B.

Afterwards, the processes similar to those illustrated in FIGS. 3E-3F are performed. As a result, the inner spacers 136 are formed, as shown in FIG. 10C in accordance with some embodiments. In some embodiments, the edge elements 105a-105d protrude from the surfaces of the inner spacers 136, as shown in FIG. 10C. In some embodiments, each of the inner spacers 136 has rounded or curved sidewalls.

Afterwards, the processes similar to those illustrated in FIGS. 3G-3K are performed. As a result, the structure shown in FIG. 10D is formed, in accordance with some embodiments. As shown in FIG. 10D, the edge elements 105a-105d of the channel structures 104a'-104d' extend exceeding the edges of the inner spacers 136 and extend into the epitaxial structures 138, in accordance with some embodiments.

In some embodiments, there are four channel structures (such as the semiconductor nanostructures 104a'-104d') formed. However, embodiments of the disclosure are not limited thereto. Many variations and/or modifications can be made to embodiments of the disclosure. In some embodiments, the total number of the semiconductor nanostructures is greater than four. In some other embodiments, the total number of the semiconductor nanostructures is smaller than four. The total number of the semiconductor nanostructures (or channel structures) of each semiconductor device structure may be fine-tuned to meet requirements. For example, the total number of the semiconductor nanostructures may be 3 to 8. The semiconductor nanostructures may have many applicable profiles. The semiconductor nanostructures may include nanosheets, nanowires, or other suitable nanostructures.

Embodiments of the disclosure form a semiconductor device structure with an extra embedded epitaxial structure. Through partially removing an isolation structure surrounding a lower portion of a fin structure, the side surface of the fin structure is partially exposed. Afterwards, an epitaxial growth process is used to form an epitaxial structure on the fin structure to function as a source/drain structure. Meanwhile, an embedded epitaxial structure is also grown on the exposed side surface of the fin structure. The epitaxial structure may vertically overlap the embedded epitaxial structure thereunder. The embedded epitaxial structure may function as an extra dopant resource and/or an extra stressor. The performance and reliability of the semiconductor device structure may therefore be improved.

In accordance with some embodiments, a semiconductor device structure is provided. The semiconductor device structure includes a stack of channel structures over a semiconductor fin and a gate stack wrapped around the channel structures. The semiconductor device structure also includes a source/drain epitaxial structure adjacent to the channel structures and an isolation structure surrounding the semiconductor fin. A protruding portion of the semiconductor fin protrudes from a top surface of the isolation structure. The semiconductor device structure further includes an embedded epitaxial structure adjacent to a first sidewall of the protruding portion of the semiconductor fin.

In accordance with some embodiments, a semiconductor device structure is provided. The semiconductor device includes a channel structure over a semiconductor fin and a gate stack wrapped around the channel structure. The semiconductor device structure also includes a first epitaxial structure connected to the channel structure and an isolation structure surrounding the semiconductor fin. The semiconductor device structure further includes a second epitaxial structure extending from a sidewall of the semiconductor fin. The first epitaxial structure vertically overlaps the second epitaxial structure.

In accordance with some embodiments, a method for forming a semiconductor device structure is provided. The method includes forming a fin structure over a semiconductor substrate and surrounding a lower portion of the fin structure with an isolation structure. The method also includes forming a gate stack across a portion of the fin structure and partially removing the isolation structure to expose a side surface of the lower portion of the fin structure. The method further includes forming a first epitaxial structure on the fin structure and forming a second epitaxial structure on the side surface of the lower portion of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure over a semiconductor substrate;
   surrounding a lower portion of the fin structure with an isolation structure;
   forming a gate stack across a portion of the fin structure;
   forming a spacer layer over the gate stack and the fin structure;

partially removing the isolation structure and the spacer layer to expose a side surface of the lower portion of the fin structure that is originally covered by the isolation structure, wherein a remaining portion of the spacer layer forms a dielectric supporting element beside the fin structure, a bottom surface of the dielectric supporting element is exposed after the partial removal of the isolation structure, a second side surface of the lower portion of the fin structure is opposite to the side surface, and the second side surface is covered by the isolation structure;

forming a first epitaxial structure on the fin structure after the isolation structure is partially removed to expose the side surface of the lower portion of the fin structure that is originally covered by the isolation structure; and forming a second epitaxial structure on the side surface of the lower portion of the fin structure after the isolation structure is partially removed to expose the side surface of the lower portion of the fin structure that is originally covered by the isolation structure, wherein a topmost surface of the second epitaxial structure is closer to the semiconductor substrate than a topmost surface of the first epitaxial structure.

2. The method for forming a semiconductor device structure as claimed in claim 1, wherein the first epitaxial structure and the second epitaxial structure are simultaneously formed.

3. The method for forming a semiconductor device structure as claimed in claim 1, wherein the fin structure is partially removed before forming the first epitaxial structure.

4. The method for forming a semiconductor device structure as claimed in claim 3, wherein the partial removal of the fin structure and the partial removal of the isolation structure are performed simultaneously using an etching process.

5. The method for forming a semiconductor device structure as claimed in claim 4, wherein a reaction gas mixture used in the etching process comprises a polymer-generating gas and an etching gas.

6. The method for forming a semiconductor device structure as claimed in claim 1, wherein the second epitaxial structure is formed to be separated from the first epitaxial structure by the fin structure.

7. The method for forming a semiconductor device structure as claimed in claim 1, wherein the second epitaxial structure is formed to be in direct contact with the fin structure.

8. The method for forming a semiconductor device structure as claimed in claim 1, wherein the second epitaxial structure is formed to be in direct contact with the first epitaxial structure.

9. The method for forming a semiconductor device structure as claimed in claim 1, wherein the second epitaxial structure is between the dielectric supporting element and the isolation structure, wherein a topmost end of the dielectric supporting element is between the second epitaxial structure and a widest portion of the first epitaxial structure.

10. The method for forming a semiconductor device structure as claimed in claim 9, wherein the second epitaxial structure is formed to be in direct contact with the dielectric supporting element.

11. A method for forming a semiconductor device structure, comprising:

forming a first semiconductor fin and a second semiconductor fin over a substrate;

surrounding lower portions of the first semiconductor fin and the second semiconductor fin with an isolation structure;

forming a spacer layer over the first semiconductor fin and the second semiconductor fin;

partially removing the spacer layer and the isolation structure to expose a side surface of the first semiconductor fin and opposite side surfaces of the second semiconductor fin, wherein remaining portions of the spacer layer form a first dielectric supporting element beside the first semiconductor fin and a second dielectric supporting element beside the second dielectric supporting element, and bottom surfaces of the first dielectric supporting element and the second dielectric supporting element are exposed after the isolation structure is partially removed;

forming a first epitaxial structure on the first semiconductor fin, wherein the first epitaxial structure has a first dopant concentration;

forming a second epitaxial structure on the second semiconductor fin;

forming a first embedded epitaxial structure on the side surface of the first semiconductor fin, wherein the first embedded epitaxial structure and the first epitaxial structure are simultaneously formed, the first embedded epitaxial structure has a second dopant concentration, and the second dopant concentration is greater than the first dopant concentration; and forming second embedded epitaxial structures on the opposite side surfaces of the second semiconductor fin.

12. The method for forming a semiconductor device structure as claimed in claim 11, wherein the first epitaxial structure, the second epitaxial structure, the first embedded epitaxial structure, and the second embedded epitaxial structures are simultaneously formed.

13. The method for forming a semiconductor device structure as claimed in claim 11, wherein the partial removal of the isolation structure forms a recess in the isolation structure, the recess exposes the side surface of the first semiconductor fin and one of the opposite side surfaces of the second semiconductor fin.

14. The method for forming a semiconductor device structure as claimed in claim 13, wherein the partial removal of the isolation structure further forms a second recess in the isolation structure, the first semiconductor fin is between the recess and the second recess, and the recess is deeper than the second recess.

15. The method for forming a semiconductor device structure as claimed in claim 14, wherein the recess is wider than the second recess.

16. A method for forming a semiconductor device structure, comprising:

forming a fin structure over a substrate;

surrounding a lower portion of the fin structure with an isolation structure;

forming a spacer layer over the fin structure;

partially removing the isolation structure and the spacer layer to partially expose a side surface of the fin structure, wherein a remaining portion of the spacer layer forms a dielectric supporting element beside the fin structure, and a bottom surface of the dielectric supporting element is exposed after the partial removal of the isolation structure;

forming a first epitaxial structure on the fin structure; and forming a second epitaxial structure on the side surface of the fin structure, wherein the first epitaxial structure is wider than the second epitaxial structure, and the second epitaxial structure has a curved surface and gradually shrinks along a direction towards the first epitaxial structure, wherein the first epitaxial structure and the second epitaxial structure are simultaneously formed, and the first epitaxial structure is separated from the second epitaxial structure.

17. The method for forming a semiconductor device structure as claimed in claim 16, wherein the first epitaxial structure and the second epitaxial structure are doped with a same type of dopant.

18. The method for forming a semiconductor device structure as claimed in claim 16, wherein after the partial removal of the isolation structure, a second side surface of the fin structure is partially exposed.

19. The method for forming a semiconductor device structure as claimed in claim 18, further comprising:
   forming a third epitaxial structure on the second side surface of the fin structure, wherein the third epitaxial structure is separated from the first epitaxial structure and the second epitaxial structure.

20. The method for forming a semiconductor device structure as claimed in claim 19, wherein the first epitaxial structure, the second epitaxial structure, and the third epitaxial structure are simultaneously formed.

* * * * *